United States Patent [19]
Shrader

[11] 4,038,484
[45] July 26, 1977

[54] ELECTRON BEAM HEATING SYSTEM
[75] Inventor: Alan C. Shrader, Redmond, Oreg.
[73] Assignee: Airco, Inc., Montvale, N.J.
[21] Appl. No.: 697,904
[22] Filed: June 21, 1976
[51] Int. Cl.² .................................. H01J 37/305
[52] U.S. Cl. ........................... 13/31; 219/121 EB
[58] Field of Search ................... 13/31; 219/121 EB
[56] References Cited
U.S. PATENT DOCUMENTS

| | | | |
|---|---|---|---|
| 3,622,679 | 11/1971 | Kennedy | 219/121 EB X |
| 3,655,902 | 4/1972 | Firestone et al. | 13/31 |
| 3,710,072 | 1/1973 | Shrader et al. | 219/121 EB |

Primary Examiner—R. N. Envall, Jr.
Attorney, Agent, or Firm—David A. Draegert; Edmund W. Bopp

[57] ABSTRACT

An electron beam heating system wherein the source of the electron beam is positioned in spaced offset relation to, and beneath the level of the target to be heated, and the beam is initially directed in the general direction of the target, and is subsequently deflected by transverse magnetic fields into a path of generally S-shape that extends between the heating source and the target.

9 Claims, 4 Drawing Figures

ELECTRON BEAM HEATING SYSTEM

BACKGROUND OF THE INVENTION

Electron beam heating systems have been commonly used for vacuum furnace metal refining and also for vaporizing material to be deposited in high vacuum deposition processes. In such systems, one or more electron beam gun assemblies direct high energy electron beams onto the target to be heated, generally by means of magnetic fields that extend transversely of a beam of electrons so as to deflect the beam 180° or more into a curving path and onto the target. In beam deflection of such degree, the electron beam source can be positioned beyond a line-of-sight from the target so that it is protected from contamination by vaporized target metal. The development of electron beam heating systems of this type has over a number of years resulted in numerous improvements, such as various magnetic devices for controlling the size and location of the spot at which the electron beam impacts the target. In general, such prior art devices use transverse magnetic fields to cause angular deflection of the electron beam 180° or more along a path of continuous positive curvature that extends from the source itself to the target, an example being shown in U.S. Pat. No. 3,450,824, granted June 17, 1969 to Hanks et al.

The present invention concerns a further improvement for increasing the functional efficiency of the electron beam wherein the beam is controlled so as to have a unique path that is found to provide more effective heating of the target.

SUMMARY OF THE INVENTION

The invention essentially comprises a method and apparatus for shaping the path of an electron beam between the beam source and the target so that the beam emergent from the source (electron gun) in an initial direction is magnetically deflected through a net curvature, arbitrarily called positive, into a final direction in which the beam is incident on the target surface and where the beam is magnetically deflected into an intermediate path section of comparatively negative curvature.

In the disclosed embodiment of the invention, the electron beam source is disposed beneath the level of the target surface of the crucible melt of evaporant, and in spaced offset relation thereto or beyond the line-of-sight from the target so that the emerging electron beam is initially directed in the general direction of the target. The beam is then magnetically deflected through a negative curvature into an intermediate direction, following which it is reversely deflected by a strong interacting field into a path of positive curvature to impinge finally on the target surface. Thus, the resulting configuration of the beam in simple form is S-shape.

This control of the electron beam configuration wherein a section of comparatively negative curvature is included in the essentially net-positive curvature of the beam impinging on the target, has been found markedly to improve the performance and heating efficiency of the electron beam over prior heating systems of this character. The reason for such improved performance is not known to Applicant at this time.

A principal object of the invention, therefore, is to provide an improved electron beam heating system that more efficiently utilizes energy of the electron beam.

Another object is to provide an improved and economical system of the character above wherein the invention can be practiced by minor modifications of existing prior-type electron beam heating equipment.

A further and related object of the invention is to provide an improved electron beam furnace, especially for metal refining, that requires less heating power and is economical and efficient in operation.

Other objects, features, and advantages will appear from the following description with reference to the accompanying drawings.

DESCRIPTION OF PREFERRED EMBODIMENT

Figure 1:
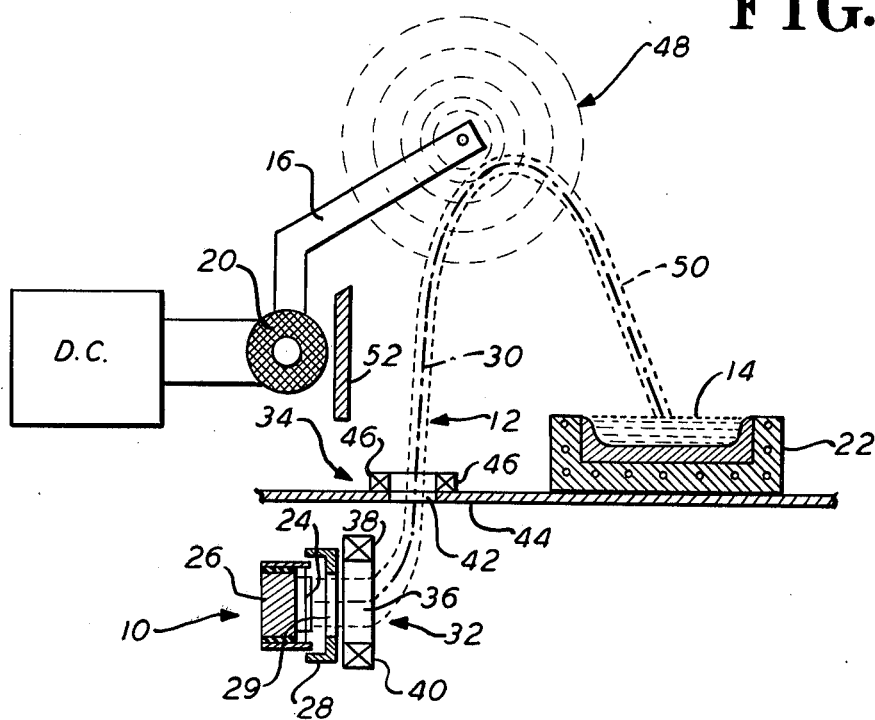
FIG. 1 is a view in elevation of an electron beam vacuum furnace embodying the invention.

FIG. 1 illustrates by way of example, an electron beam heating system having particular application to a vacuum furnace for practicing the invention. The electron beam system of FIG. 1 is shown as a simple and inexpensive modification of the electron beam furnace disclosed in U.S. Pat. No. 3,655,902, granted Apr. 11, 1972 to Firestone, et al, and assigned to the assignee of the present invention. Accordingly, the disclosure of this patent, where relevant, is incorporated by reference in the present specification.

Figure 2:
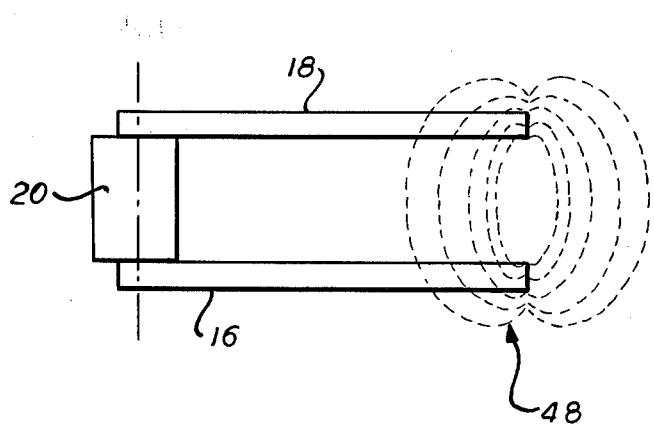
FIG. 2 is a detail plan view of magnetic field producing means shown in FIG. 1.

In general, the essential components of the electron beam heating system of the invention comprise an electron beam gun 10 for producing an electron beam 12, and a plurality of magnetic means presently described for directing the beam to a target 14. The magnetic directing means is of the type which deflects the electron beam through a large angle, such as greater than 180°, so that the electron beam gun can be positioned beyond the line — of — sight from the target. The magnetic directing means include a pair of bar-shaped pole pieces 16 and 18 positioned above the target and energized by a coil 20 to produce a transverse magnetic field in the path of the beam. The pole pieces have their longitudinal axes in a common plane as indicated in FIG. 2, and are positioned to produce a transverse magnetic field of sufficient strength so that the electron beam is deflected to emerge from the magnetic field on the same side of the common plane as the side from which it enters.

The target in the present instance comprises a molten material 14 contained by a crucible or hearth 22. The target material may be, for example, evaporant metal suitable for use in a high vacuum deposition process. The electron beam heating system is both instances is contained within an evacuated enclosure (not shown) according to standard practice. Well known means for cooling and for feeding the molten material to, and drawing it from the hearth can be used as required. One or more electron beam guns 10 of similar type may be used according to target heating requirements, such as where the target comprises a long, linear hearth and solidification of molten material continuously flowing into the hearth must be avoided.

The electron beam gun itself may be of any suitable type, a preferred form, however, being that shown and described in U.S. Pat. No. 3,514,656 granted to R. W. Fisk. In brief, the electron beam gun as shown comprises a tungsten wire emitter 24, the supporting terminal members of which are energized from a direct current source (not shown) to produce free electrons. The electron emitter is positioned within a shaping electrode 26 that is maintained at the emitter potential so that the free electrons tend to move out of and away from the shaping electrode 26. These free electrons are accelerated into a beam by an accelerating electrode (anode) plate 28. The plate has a central opening 29 for the electrons and is maintained at a potential more positive than that of the emitter and electrode 26 to produce an acceleration of the electrons. The result is a ribbon beam having an elongated cross section which approximates a narrow oval with a major axis plane extending through the emitter.

An initial orientation of the electron beam with respect to the emitter 24 is caused by the high intensity circumferential field due to the emitter's d.c. heating current. As a result, the electrons leave the emitter at an acute angle in the major axis plane, the central axis of the ribbon beam being indicated by the heavy dash-dot line 30. After leaving the anode opening 29, the electron beam 12 is deflected roughly through a right angle into a curved path that approximates S-shape throughout by means of transverse magnetic fields hereinafter described.

It will be noted that although the electron beam gun is disposed well beneath the level of the target surface as in accepted prior practice, the electron beam is directed initially in a direction opposite to that of electron beam guns of the prior art as regards its relation to the target. That is, the prior deflection assemblies deflect the beam from the emitter along a path of continuous, denoted positive, curvature to the target. The initial direction of the beam is in a general direction away from the target and the beam is deflected through a total angle of roughly 270°. In the present invention, the total deflecton is through a net positive angle, but initally the beam is headed in a general direction toward the target, and the beam is first deflected along a path which has a negative curvature. After first being deflected through a negative angle of approximately 90°, the upwardly deflected beam is then deflected through a positive angle of approximately 180° so that it is directed downward onto the target. Thus, the beam path throughout is seen to resemble an S-curve It has been found that for a given power input to the electron beam gun of the invention, the target heating is significantly greater than in gun assemblies of the prior art described above. The phenomenon resulting in such improvement is unknown to Applicant.

Figure 3:
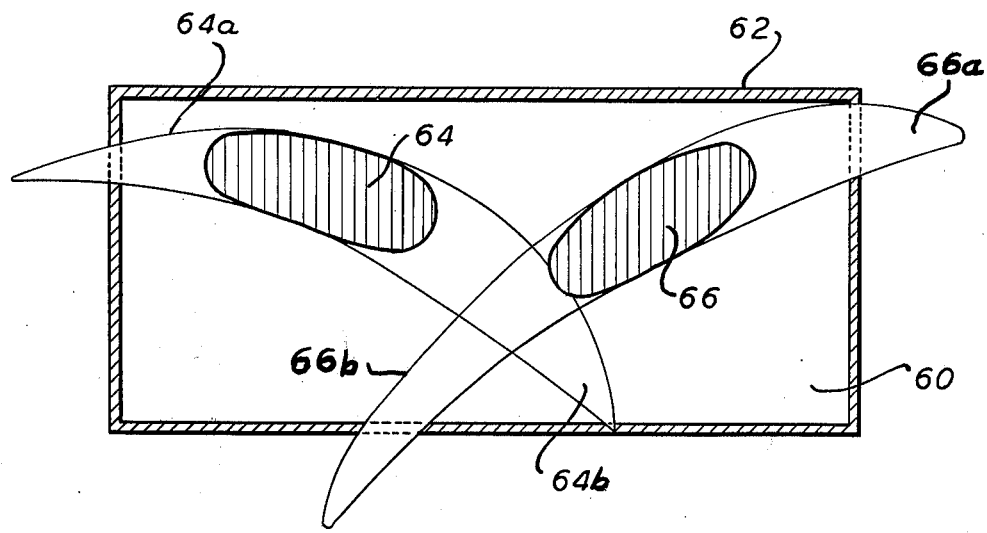
FIG. 3 is a graphic representation of characteristic electron beam heating effects of two beams focussed by typical prior art devices on a target.
Figure 4:
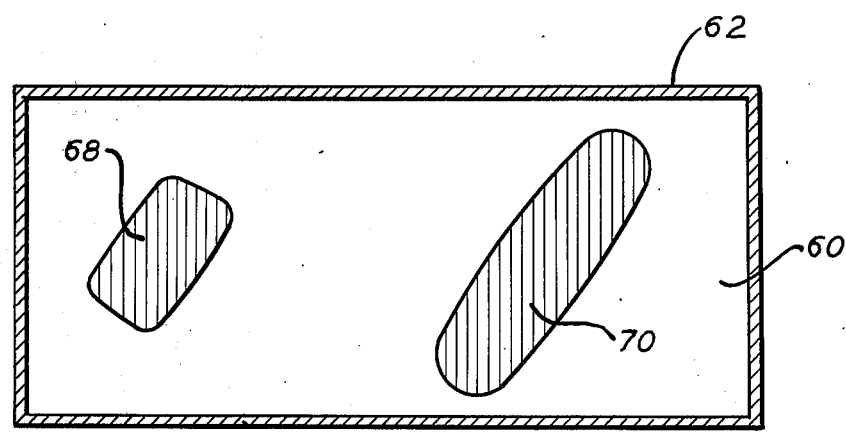
FIG. 4 is a similar representation of characteristic heating effects of two electron beams of similar power focussed on the same target in accordance with the invention.

For visually depicting the improved operation of the invention in practice, reference is made to FIGS. 3 and 4 which represent observations made during comparative electron beam heating tests on target material indicated at 60. The target material was contained in an 18 inches × 40 inches slab mold or crucible 62. In both tests, two electrom beam guns of the beam display power (1 ampere) were used.

In FIG. 3, typical two-gun equipment of the prior art produced the respective spots of intense flow, represented by 64 and 66, where the major portion of each beam impacts on the target. Visible heating effects caused by strong electrons or beam "tails" were noted, as shown generally at 64a and 64b, to extend material distances along a curving, longitudinal axis from both ends of the elongated heating spot 64. A similar tail heating effect was observed for the heating spot 66, where elongated tails 66a and 66b were noted in both instances to extend from spots across the target and beyond the mold itself.

In FIG. 4, a two-gun electron beam heating equipment made in accordance with the invention as disclosed, produced the heating spots shown at 68 and 70, respectively, on the target 60. No heating tails of any consequence extending from the spots were observed, thereby indicating that the electron beam energy was concentrated in the beam spot and essentially used only for target heating.

Other tests of the invention with beam display power increased from 1 ampere to 2 amperes indicated that there was practically no variation in the beam spot size, i.e., the electron beam tended to follow the same compact cross-section with increased heating power.

A proposed reason for the observed improvements in target heating resulting from this invention is that by deflecting the electron beam in the generally defined "S" path, each "pencil" or ray element of the beam travels on the average more nearly through an equal distance and through comparable strength of magnetic field over its total journey from source to target. Thus, as compared with the prior art where the entire electron journey is through a constant, single-direction curvature, wherein the various ray elements in the cross-section of the beam travel through differing paths depending upon their position in the beam, it appears reasonable to assume that since the different paths cover different distances and pass through different field strengths, the net result will be a less homogeneous total beam and hence a more diffused beam spot on the target than that achieved by the present invention.

Returning to structural features of the preferred embodiment of the invention, especially the means for producing the magnetic fields that shape the beam path, three magnetic systems are involved, namely (1) a system 32 for initial deflection of the path through roughly 90° mentioned above, (2) a focusing system 34 for the upwardly extending part of the electron beam, and (3) a main deflecting system including the pole pieces 16, 18, for reversing the direction of the beam for target impact.

At the initial part of the beam, a transverse magnetic field is established by the first system 32 between a pair of spaced bar pole pieces 36 that extend parallel with the emitter 24 on either side of the beam 12. Magnets 38 and 40 with identically oriented polarities, extend between the upper and lower ends of the pole pieces, respectively, and cause an upward deflection of the electron beam 12 approaching a right angle as illustrated, and as set forth in U.S. Pat. No. 3,514,656 referred to above.

After leaving the electron beam gun and after being deflected upwardly by the magnet system 32 through a change in direction of somewhat less than 90° representing a curvature in a sense which is arbitrarily called negative curvature, the beam is passed through an opening 42 in a vapor barrier 44. At this point, further focussing and deflection of the electron beam in opposite lateral directions to provide sweep of the beam impact spot across the target surface is provided by the magnet system 34 that includes a set of pole pieces for providing orthogonal deflection of the beam as it passes just above the opening 42. In brief, four solenoid-type electro-magnetic coils 46 are arranged with their axes intersecting to define a rectangular planar region as disclosed in U.S. Pat. No. 3,622,679. Variation in the energization of the coils produces a change in the amount and sense of deflection of the beam.

The upwardly extending beam now starts to come within the influence of the main transverse magnetic field 48 (third system) so that it approaches the main pole pieces 16, 18, at a gradual angle as schematically indicated in FIG. 1. The depth at which the electron beam penetrates the region directly between the pole pieces (the region of field uniformity) is limited to that depth which would avoid undue limitation of the amount of beam sweep which is possible. The transverse magnetic field strength is selected to avoid penetration of the beam past a plane extending between the longitudinal axes of the pole pieces 16 and 18.

The pole piece configuration is selected to offset any tendency for field strength to fall off at the ends of the pole pieces. For example, dipoles may be used; or the pole pieces themselves can converge in the manner of the dipoles as shown in FIGS. 3 and 4 of U.S. Pat. No. 3,655,902, above, thereby assuring a stronger field at the extremities of the pole pieces.

As the beam comes into the increasingly stronger transverse field, it is increasingly deflected into further positive curvature so that as it passes the tips of the pole pieces 16, 18 where a strong transverse field exists, the beam is practically reversed in direction. Specifically, the beam, still in a path of positive curvature, is now looped downward at 50 in a direction to impact on a mid-section of the target. This downward deflection is preferably at an angle between about 30° and 60° from the vertical. An angle greater than 60° with respect to the vertical generally results in a beam spot which is too spread out. An incident angle of less than 30° with respect to the vertical may necessitate the positioning of the pole pieces too close to the region directly above the target, where the tendency for condensate to collect on the pole pieces is undesirably high.

The pole pieces 16 and 18 are positioned at such an angle that the magnetic field established thereby deflects the beam back at a preferred angle downwardly and over toward the target 14. The magnet coil 20 is sufficiently energized by the d.c. source so that the beam does not penetrate any appreciable distance into the field region directly between the pole pieces, but rather is deflected through a change in direction of roughly 140° entirely or nearly entirely, within the fringe region of the field, and emerges from the field on the same beam side as the side from which it entered. Thus, the field established by the pole pieces functions generally in the manner of an optical mirror. For preventing premature deflection and distortion of the beam by magnetic fields adjacent to the magnet coil 20 and connected sections of the pole pieces, a shield 52 of ferro-magnetic material is positioned between the ascending part of the beam and the coil 20.

The three-dimensional characteristic of the magnetic field is generally illustrated by FIG. 1 in connection with FIG. 2 wherein the lines of force are represented generally in their relative position and intensity. The deflection of the electron beam takes place almost entirely within the curving or fringe portion of the magnetic field established below the region directly between and somewhat beyond the pole pieces and occurs without significant dispersion or distortion. As the electrons toward the outside of the curving path of the beam remain longer within the magnetic field due to the more gradual approach angle, and so pass through stronger regions of the field than electrons toward the inner edges of the beam, a sort of focusing action in the plane of the curving beam is believed to occur that tends to maintain a cohesive cross section and prevent subsequent diffusion of the beam. Proper adjustment of the electron gun magnetics described above, can also aid in minimizing defocusing effects by keeping the beam cross section reasonably compact.

The cohesive character of the beam accordingly, has been found to be advantageous in a number of respects, including elimination of power losses due to stray electrons (beam tails) mentioned above, protection of equipment adjacent to the beam that otherwise could be overheated and damaged by the beam tails, and greater freedom in placement of the primary beam spot on the target that otherwise would be restricted by exposing adjacent equipment to tails. It has also been found that the electron beam of the invention is more easily controlled for precise positioning of the beam spot on the target for obtaining a desired heating effect.

The configuration and geometry of the pole pieces and their relation to the target, gun power, etc., can be varied to achieve the desired beam spot size and deflection characteristics, generally as described in U.S. Pat. No. 3,655,902, above.

Having set forth the invention in what is considered to be the best embodiment thereof, it will be understood that changes may be made in the system and apparatus as above set forth without departing from the spirit of the invention or exceeding the scope thereof as defined in the following claims.

I claim:

1. In an electron beam heating system having a gun for producing an electron beam and magnetic means for deflecting the beam onto a target to be heated, the method of shaping the path of the beam which comprises:
   a. positioning the gun beyond the line-of-sight from the target;
   b. directing the beam from the gun in an initial direction;
   c. magnetically deflecting the beam through a path of net positive curvature into a final direction in which the beam is incident on the target; and
   d. magnetically deflecting the beam through an intermediate path section of comparatively negative curvature.

2. The method as specified in claim 1 wherein the beam is magnetically deflected through a path of negative curvature into an intermediate direction and then into a substantially reverse direction along a path of positive curvature.

3. The method as specified in claim 1 wherein the gun is positioned at a level below the target and the initial beam direction is horizontal and generally toward the target, and the beam is deflected from its initial direction through an angle of less than 90°.

4. The method as specified in claim 1 wherein the gun is positioned at a level below the target surface.

5. The method as specified in claim 4 wherein the beam path of net positive curvature is generally of S-shape.

6. The method as specified in claim 4 wherein the magnetic means includes magnet pole pieces disposed at a level above the target for producing a magnetic field transverse to the beam, and the beam approches the field along its path of negative curvature and is deflected and reversed in direction by the field into a path of positive curvature toward the target.

7. The method as specified in claim 6 wherein the beam approaches the magnetic field obliquely prior to its reversal in direction.

8. In an electron beam heating system having a gun for producing an electron beam and magnetic means for deflecting the beam onto a target to be heated, the method which comprises:
 a. positioning the gun beyond the line-of-sight from the target;
 b. directing the beam initially from the gun generally in the direction of the target; and
 c. magnetically deflecting the beam from the gun along a path generally of S-shape that terminates at the target.

9. An electron beam apparatus for heating a target, comprising:
 an electron gun positioned beyond the line-of-sight from the target;
 means for directing the bea from the gun in an initial direction generally toward the target;
 magnetic means for deflecting the beam through a path of net positive curvature into a final direction in which the beam is incident on the target, and for deflecting the beam through an intermediate path section of comparative negative curvature.

* * * * *